United States Patent [19]

Simmonds

[11] 4,386,361

[45] May 31, 1983

[54] THIN FILM SQUID WITH LOW INDUCTANCE

[75] Inventor: Michael B. Simmonds, Del Mar, Calif.

[73] Assignee: S.H.E. Corporation, San Diego, Calif.

[21] Appl. No.: 191,176

[22] Filed: Sep. 26, 1980

[51] Int. Cl.³ .................. H01L 39/22; H03K 3/38
[52] U.S. Cl. .................................. 357/5; 307/306
[58] Field of Search .................. 357/5; 307/306; 324/248

[56] References Cited

U.S. PATENT DOCUMENTS 4,280,095 7/1981 Hinton .................. 357/5 X

OTHER PUBLICATIONS

H. Krogen, C. N. Potter and D. W. Jillie, "Niobium Josephson Junctions with Doped Silicon Barriers", *IEEE Transactions on Magnetics*, vol. MAG-15 (1979), pp. 488-489.

J. E. Zimmerman, "Sensitivity Enhancement of Superconducting Quantum Interference Devices through the Use of Fractional-Turn Loops", *Journal of Applied Physics*, vol. 42, No. 11 (1971), pp. 4483-4487.

*Primary Examiner*—Martin H. Edlow
*Assistant Examiner*—J. Carroll
*Attorney, Agent, or Firm*—Christie, Parker & Hale

[57] ABSTRACT

A thin film SQUID device in which one or two thin film Josephson junctions are positioned at the hub of a wheel-shaped conductive structure including an outer closed loop rim and a plurality of radial arms or spokes formed on a substrate. A first group of alternate arms connects to one side of the junctions and a second group of intermediate arms connects to the other side of the junctions, the two groups of arms being insulated from each other at the hub. An overlying conductive pattern forms a coil in which the conductive turns of the coil include portions extending parallel to each of the arms to provide inductive coupling to currents circulating through loops formed by the groups of radial arms and rim.

10 Claims, 4 Drawing Figures

THIN FILM SQUID WITH LOW INDUCTANCE

FIELD OF THE INVENTION

This invention relates to a superconducting quantum interference device or SQUID, and more particularly, to a planar thin film SQUID having low inductance.

BACKGROUND OF THE INVENTION

SQUID sensors are well-known for use in measuring small magnetic fields or small voltages. SQUID sensors generally use one or two Josephson junctions connected in a closed superconducting loop. Generally the sensors have been designed using a toroid of superconductive materials such as niobium with a point contact junction in the toroid forming the Josephson junction. An input signal is inductively coupled to the loop through a high inductance input coil. SQUID's have also been constructed using thin film techniques in which the Josephson junctions are formed by thin film barriers. However, thin film SQUID designs heretofore proposed have presented problems in terms of obtaining favorable coupling coefficients between the input coil and the SQUID so as to achieve high energy sensitivity while maintaining large input coil inductance to achieve effective matching to external circuits. One difficulty encountered in designing an optimumly coupled thin film SQUID is the spreading inductance in the vicinity of the junctions which adds to the overall inductance of the SQUID loop with resulting decrease in signal power. The inductance of the SQUID loop cannot be effectively coupled to the signal coil and is therefore equivalent to a large leakage inductance. The second problem has been that because the SQUID loop must have a low inductance to minimize SQUID noise, it is difficult to devise a high inductance signal coil in combination with the SQUID loop.

SUMMARY OF THE INVENTION

The present invention provides an improved low inductance thin film SQUID design which is inherently insensitive to uniform fields or gradients, yet is efficiently coupled to a large inductance signal coil. The design permits the SQUID to be relatively large, simplifying its construction and manufacture. The design of the SQUID with its input coil permits the junctions to be located at a point where the magnetic fields generated by the signal coil are zero. This is desirable since Josephson junctions have an inherent sensitivity to magnetic fields, which causes a nonlinear SQUID response. Also, the central location of the junction in the SQUID reduces the stray spreading inductances, that is, the inductances which cannot be coupled to by the signal coil and which otherwise degrade the energy sensitivity of the device to the input coil.

These and other advantages of the present invention are achieved by providing a thin film SQUID device formed on a substrate in which a first conductive layer on the substrate is in the form of a spoked wheel. Thus the first conductive layer provides an outer closed loop and a first group of radial conductive arms extending from the loop and intersecting at a common center or hub. The first conductive layer also includes a second group of radial conductive arms extending inwardly from the loop at points intermediate the first group of arms but insulated at their inner ends from the hub. One thin film Josephson junction (or two connected in series) is positioned at the center and connected electrically between the two groups of arms. An outer conductive layer is in the form of a continuous conductor forming a multi-turn coil in which portions of the coil extend parallel to each of the arms of the two groups for inductively coupling the coil to the SQUID formed by the conductive arms.

BRIEF DESCRIPTION OF THE DRAWINGS

For a better understanding of the invention reference should be made to the first conductive layer of the accompanying drawings, wherein.

DETAILED DESCRIPTION

Figure 1:
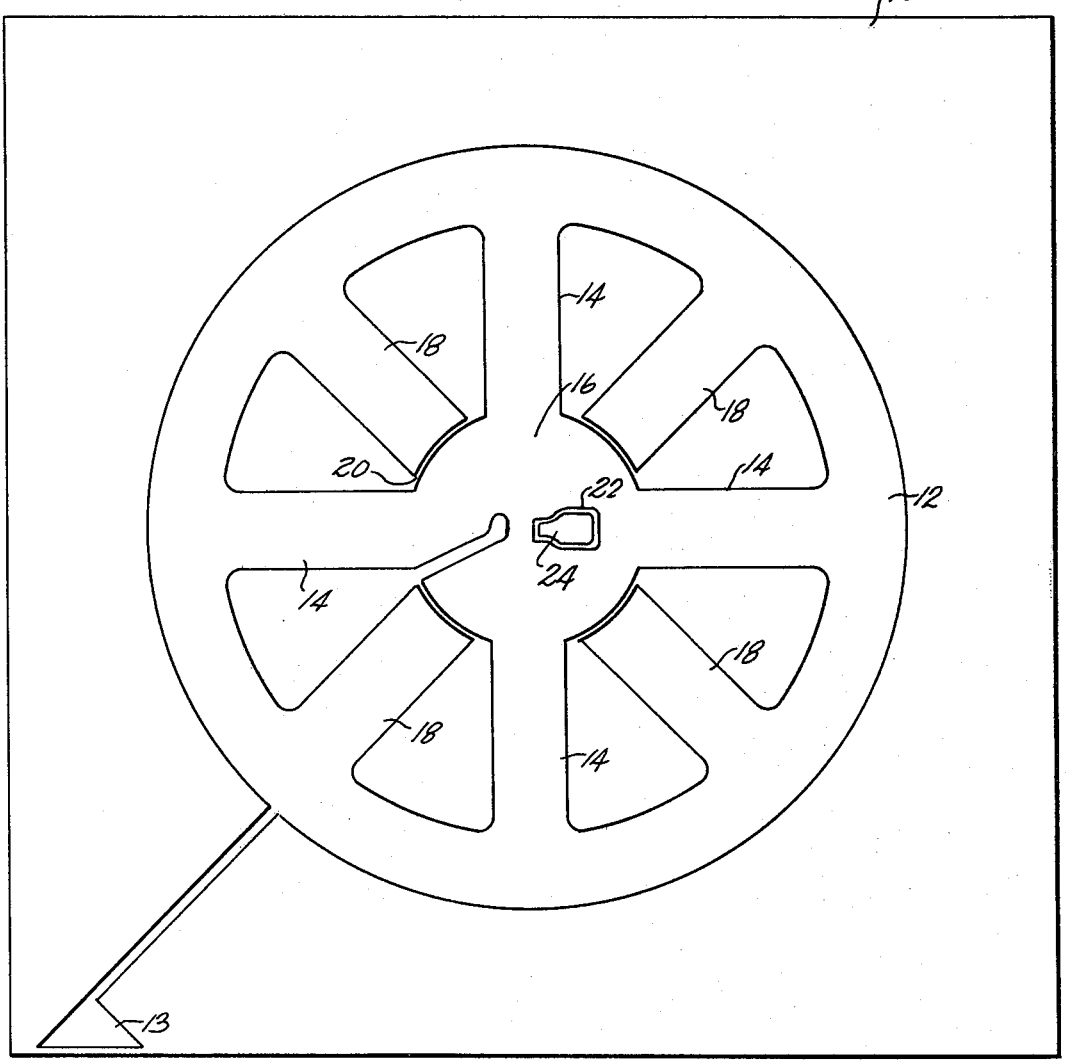
FIG. 1 is a plan view of the SQUID.

Referring to the drawings in detail, the thin film SQUID of the present invention is constructed on a substrate 10 such as a silicon wafer using standard photolithography and etching techniques. A first conductive layer of superconductive material such as niobium is deposited by sputtering, electron beam evaporation, or other conventional technique in a wagon wheel shaped pattern including an outer circular rim 12, a first group of four spokes 14 which are joined at their inner ends by a circular hub section 16. A second group of four spokes 18 also extend radially inwardly from the rim 12 with the inner ends terminating short of the hub 16, leaving an insulating gap 20 between the hub 16 and the spokes 18. A closed loop gap 22 in the superconductive layer of the hub section 16 forms an electrically isolated superconductive terminal 24. The rim 12 is connected to a terminal 13 at the outer corner of the substrate wafer. The thickness of the niobium is not critical but is typically one to two tenths microns.

Figure 2:
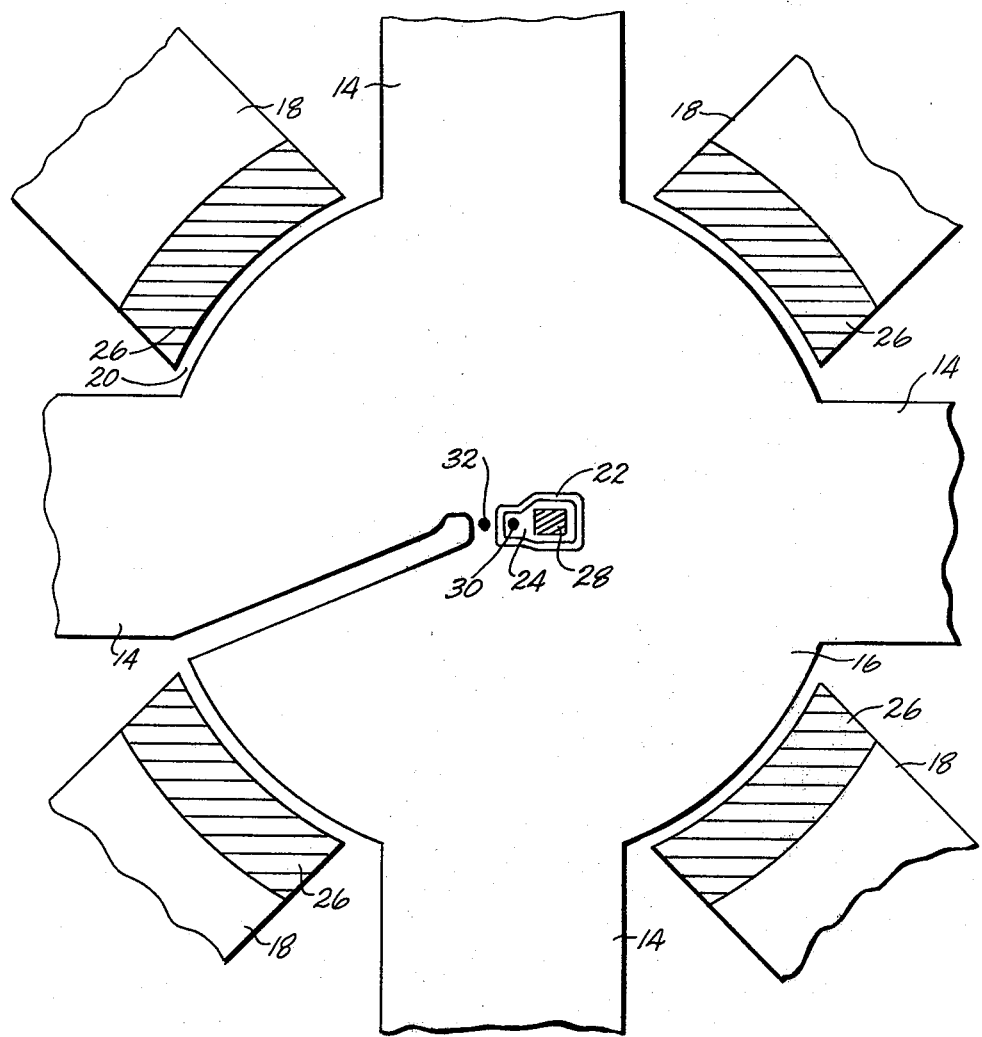
FIG. 2 is an enlarged detailed view of the central region showing the locations of the Josephson junctions.

The wagon wheel shaped superconductive layer is covered with an insulating layer of silicon dioxide, for example, except in the regions 26 (see the cross hatched areas in FIG. 2) at the inner ends of the spokes 18 and the three regions at the center of the hub indicated at 28, 30 and 32. These regions are windows in the silicon dioxide insulating layer exposing the niobium and are formed by etching away the silicon dioxide layer. The silicon dioxide layer is made thick enough to insure adequate insulation coverage of the niobium except in the regions 26, 28, 30 and 32.

A layer of semiconductive material such as doped silicon is then laid down on the substrate over the first layer of niobium and the covering layer of silicon dioxide. The semiconductor layer makes direct contact with the superconductive layer of niobium only through the window regions 26, 28, 30 and 32.

Figure 3:
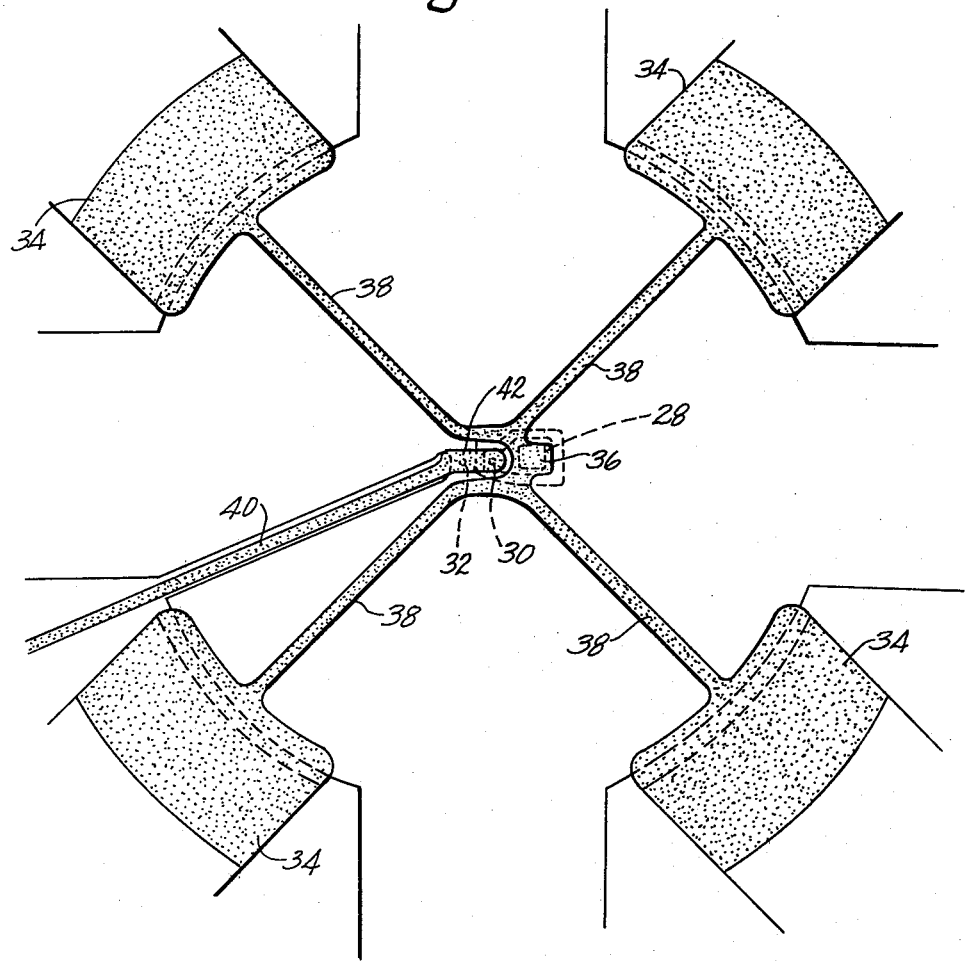
FIG. 3 is an enlarged detailed view of the second conductive layer.
Figure 4:
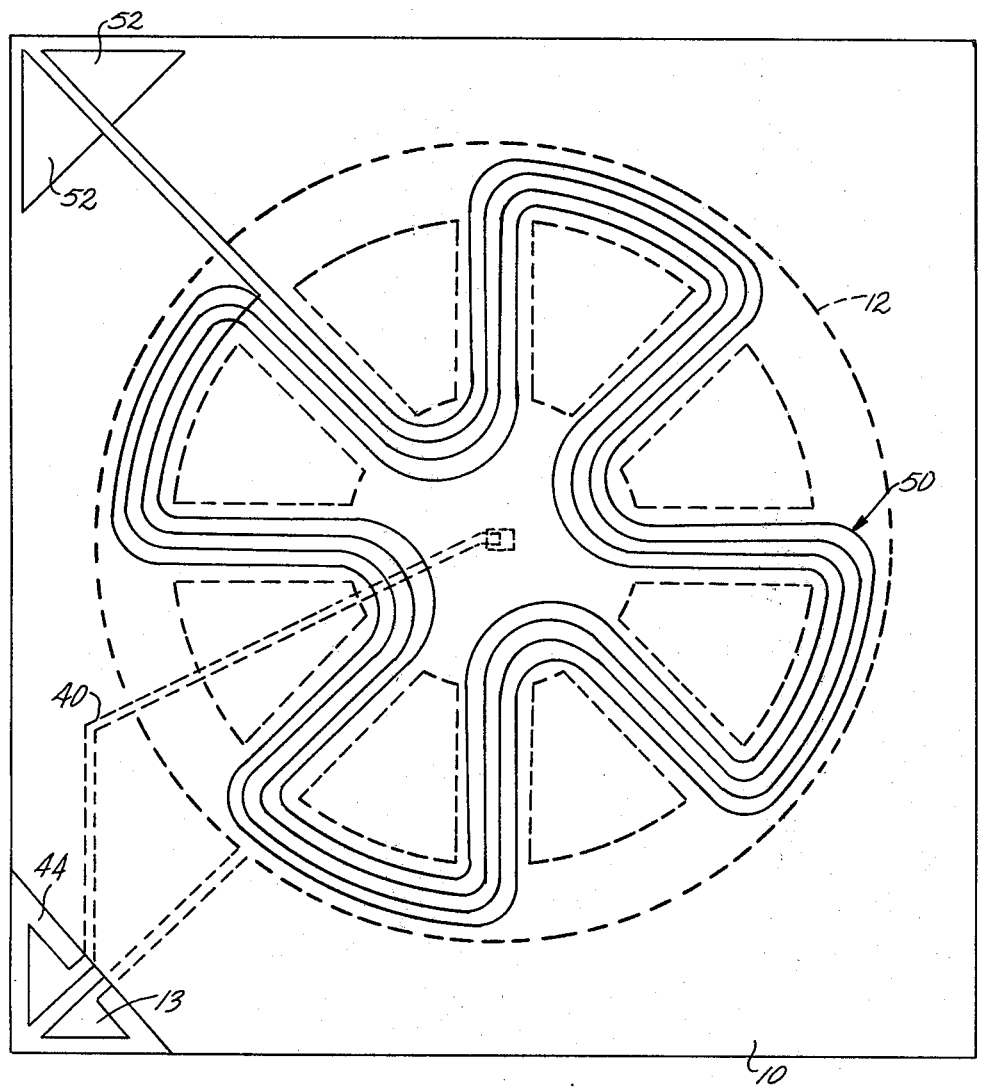
FIG. 4 is a plan view of the complete SQUID with the input coil added.

A top layer of niobium is then laid down on the substrate and etched away to form the shaded pattern shown in FIG. 3. After etching, the top layer of niobium includes an area overlying the semiconducting layer at the windows 26, as indicated at 34. The top layer of niobium also includes a central area 36 overlying the semiconductor layer at the window 28. Four strips 38 also formed from the top layer of niobium join the central area 36 to each of the outer areas 34 of the top layer of niobium. In addition, the top layer of niobium includes a separate conductive strip 40 having an area 42 which overlies both of the windows 30 and 32. The conductive strip 40 terminates in an enlarged area 44 at the corner of the substrate as shown in FIG. 4, which provides a terminal for connection to an external circuit.

The windows 30 and 32 are typically 5 microns in diameter and act as self-shunted Josephson junctions if the semiconductor barrier has the correct thickness and doping characteristics. As an example, suitable doped silicon junctions between 0.01 and 0.03 microns in thickness, with approximate critical current and shunt resistance of 5 microamperes and 10 ohms, respectively, can be made by sputter deposition in argon atmosphere containing about 0.1% phosphene gas. The construction of Josephson junctions by thin film semiconductor techniques is well-known in the art. For example, a recent reference on doped silicon Josephson junctions is H. Kroger, C. N. Potter and D. W. Jillie, IEEE Transactions on Magnetics, Volume MAG-15, p. 488 (1979), wherein the authors describe various means to fabricate such junctions and their performance characteristics. The Josephson junctions formed at 30 and 32 become the operating junctions in the SQUID.

The areas of windows 26 and 28 are made to be many times larger than the areas of 30 and 32, so they comprise Josephson junctions with critical currents many times larger than the operating junctions. During operation of the SQUID, the junctions formed at 26 and 28 act as superconducting electrical short circuits connecting the two niobium layers. Thus it will be seen that one terminal of the two Josephson junctions formed at the windows 30 and 32 by the doped silicon are connected in series by the top layer of niobium, the series connection between the two junctions being brought out electrically to the terminal 44. The other terminal of the two junctions formed by the doped silicon at the windows 30 and 32 are in turn connected in a closed loop by the set of spokes 14, the outer rim 12, the set of spokes 18, the portions 34-38 of the top layer, conductive window 28, and portion 24 of the first or bottom layer of niobium and the outer rim 12. Thus the thin film configuration described above forms a dc SQUID.

The SQUID described above comprises a plurality of loops connected in parallel and all linking through the two junctions. The path of current flow in each parallel loop is as follows: starting from the hub area 16 out along a connected spoke 14 to the rim 12, then back in along an adjacent spoke 18 (not connected directly to the hub), through the large junction at 34 (which operates as a superconducting short), along trace 38 and through the large junction at 28 (which also operates as a superconducting short), then through the operating Josephson junction at 30, along the niobium area 42 to the other operating junction at 32, returning via 32 to the hub area 16. SQUID's comprising a number of loops topologically connected in parallel in this manner are referred to as fractional-turn SQUID's following J. E. Zimmerman, Journal of Applied Physics, Volume 42, p. 4483 (1971). In the example described here it will be seen that there are, in effect, eight loops closed by the pair of operating Josephson junctions at 30 and 32. Adjacent loops have an opposite winding sense in that a uniform magnetic flux applied to the entire structure will induce oppositely directed currents to flow in each adjacent loop. Since all the loops are identical, the device will not respond to uniform fields or even uniform gradients. Thus this configuration is inherently insensitive to ambient fields.

It will be appreciated that while a dc SQUID has been described, a single Josephson junction can be used to close the loops to provide an rf SQUID configuration.

Furthermore, the number of parallel loops is not restricted to eight in number, and, in general, the rejection of ambient magnetic field and field gradients will depend on the symmetry of the loop structure. In addition, the method described for fabricating the two groups of superconductive spokes extending from the outer rim 12 to the two separate areas of common intersection, the central hub 16 and the area 36, is but one, albeit a preferred, possibility. The large area junctions formed at 26 (and at 28) could be replaced by direct metallic contact, and this area of contact could be made directly at the outer rim 12 instead of at the inner ends of the spokes 18, thus eliminating the need for spokes 18 in the first superconducting layer and replacing them by extended versions of the strips 38 in the second superconducting layer.

In order to couple magnetic fields to the device, a thin film signal coil 50 is deposited on top of the SQUID loops as shown in FIG. 4. This coil can be made from either a normal metal conductor or a superconductor, for example in the latter case, by patterning a 0.1 to 0.2 micron thick sputtered niobium film using conventional photoresist and etching methods. The ends of the coil 50 are brought out to a pair of terminals 52. The turns of the coil are positioned directly over the spokes 14 and 18 of the SQUID loop but are insulated from them by an intermediate insulating layer of silicon dioxide. The turns of the coil 50 are also configured with an alternating winding sense so that each loop of the SQUID causes current to flow in the same direction through the junctions in response to current flow through the coil 50. The number of turns of the coil typically is in the order of 10 turns although only four have been shown in the drawing for clarity.

From the above description, it will be seen that a thin film SQUID having a fractional-turn design is provided which can be readily fabricated by conventional thin film techniques. The SQUID design of the present invention has a number of advantages. It is inherently insensitive to uniform fields or gradients and therefore can be utilized under conditions of high ambient magnetic fields. The size of the SQUID can be made relatively large while still maintaining a very small inductance. This makes the SQUID easier to fabricate and allows a high inductance signal coil to be easily incorporated in the design. The hub configuration allows the junctions to be positioned at a central location where the tangential magnetic fields generated by the signal coil are zero. This avoids direct modulation of the junction critical current by the signal coil field, an undesirable effect which would degrade the linearity of the SQUID response. The central location of the junctions also reduces their stray spreading inductances. It is important to reduce the stray inductance since it cannot be coupled to by the signal coil and thus degrades the energy sensitivity of the device which is connected to the input coil.

What is claimed is:

1. A thin-film SQUID device comprising: a substrate, a superconductive layer on the substrate having an outer closed superconductive loop and a first group of radial superconductive arms extending from the loop and intersecting in a common conductive region, a second group of radial superconductive arms extending inwardly from and in electrical contact with said loop at points intermediate the first group of arms and intersecting in a common conductive region overlying the common conductive region of said first group of arms, an insulating layer between said common regions, thin film Josephson junction means positioned in electrical contact with said two common regions, and a signal coil forming conductive loops, the coil having portions extending parallel to said two groups of arms for inductively coupling the coil to the superconductive arms.

2. Apparatus of claim 1 wherein said superconductive layers are niobium.

3. Apparatus of claim 1 wherein said Josephson junction means includes a pair of Josephson junctions in series, and a layer of superconductive material insulated from the common regions of said first and second groups of arms in electrical contact with the two Josephson junctions to form the series connection between the two Josephson junctions.

4. Apparatus of claim 1 wherein the signal coil is formed from an outer layer of conductive material insulated from the underlying layers on the substrate.

5. A thin film SQUID comprising: a substrate of nonconductive material, a first layer of superconductive material on the substrate having a pattern including an outer closed loop and a plurality of angularly spaced arms extending inwardly from the outer loop to a common hub, the inner ends of alternate arms being isolated from the hub by a gap in said first layer between the inner ends of the alternate arms and the hub, the hub region having a central terminal electrically isolated by a surrounding gap in said first layer, a second layer of insulating material overlying said first layer and filling said gaps in the first layer, the second layer having openings therein exposing the first layer at the inner ends of said alternate arms, at two positions on said terminal and at one position on said hub adjacent the terminal, a third layer of doped semiconductor material filling said openings in the second layer and directly contacting the first layer, a fourth layer of superconductive material overlying the second and third layers having two isolated areas, one area electrically connecting the semiconducting layer at one of said opening positions in the terminal to the semiconducting layer at each of said openings at the inner end of said alternate arms and a second area electrically connecting the semiconductor layer at the other opening position in the terminal to the semiconducting layer at the opening in the hub, a fifth layer of insulating material overlying the fourth layer, and a sixth layer of conductive material forming a continuous multiturn conductive coil in which each turn has positions extending parallel to each of the arms, said portion being joined alternately by portions overlying the hub and by portions overlying the outer loop.

6. Apparatus of claim 5 wherein the two areas of semiconductor at the positions electrically connected to the second area of the fourth layer are sufficiently small to form Josephson junctions.

7. Apparatus of claim 5 further including means providing separate external connections respectively to the first layer, to the second area of the fourth layer, and to the coil.

8. A thin film SQUID device comprising: a wheel-shaped thin film superconductive member including an outer conductive rim and a plurality of conductive radial spokes connected to the rim at their outer ends, one set of alternate spokes being joined at their inner ends by a first superconductive layer and a second set of alternate spokes being joined at their ends by a second superconductive layer, the respective layers being electrically insulated from each other except through the spokes and rim, means forming at least one thin film semiconductor Josephson junction connected between the two layers, and a thin film conductive coil layer overlying the wheel-shaped member, the coil layer being insulated electrically from the wheel-shaped member and forming conductive paths extending parallel to each of the spokes.

9. The device of claim 8 further including a second thin film semiconductor Josephson junction, the two junctions being connected in series between the first and second superconductive layers.

10. The device of claim 9 further including a series connection between the two Josephson junctions.

* * * * *

UNITED STATES PATENT AND TRADEMARK OFFICE
CERTIFICATE OF CORRECTION

PATENT NO. : 4,386,361
DATED : May 31, 1983
INVENTOR(S) : Michael B. Simmonds

It is certified that error appears in the above—identified patent and that said Letters Patent is hereby corrected as shown below:

Column 2, line 10, delete "the first conductive layer of".

Column 2, line 12, "FIG. 1 is a plan view of the SQUID;" should read -- FIG. 1 is a plan view of the first conductive layer of the SQUID; --.

Column 6, line 3, "end" should read -- ends --.

Signed and Sealed this

First Day of November 1983

[SEAL]

Attest:

Attesting Officer

GERALD J. MOSSINGHOFF

Commissioner of Patents and Trademarks